Dec. 15, 1970 J. W. JAMES 3,548,322

ELECTRICAL GATING FILTER SYSTEM

Original Filed Sept. 15, 1964 2 Sheets-Sheet 1

3,548,322
ELECTRICAL GATING FILTER SYSTEM

John William James, Potters Bar, Middlesex, England, assignor to International Standard Electric Corporation, New York, N.Y., a corporation of Delaware Continuation of application Ser. No. 396,674, Sept. 15, 1964. This application Mar. 10, 1969, Ser. No. 805,898
Claims priority, application Great Britain, Sept. 20, 1963, 37,081/63
Int. Cl. H03b *3/04;* H03k *5/20*
U.S. Cl. 328—140 2 Claims

ABSTRACT OF THE DISCLOSURE

The circuit provides a multi-frequency signaling system wherein signals are formed responsive to received frequencies. Since the filters do not cut off sharply enough to provide an extremely reliable separation, gating means are provided for inhibiting the outputs of filters for non-received signal frequencies. Extreme reliability is required in this particular case because the signals are part of the receiver for an aircraft marker beacon. However, the circuit is not limited to this particular utilization.

This is a continuation application of U.S. application No. 396,674 filed on Sept. 15, 1964, now abandoned.

This invention relates to electrical filter systems for routing a signal to one of a number of signal paths in dependence upon its frequency. The invention enables filters of an elementary type, such as low-pass or high-pass networks using resistors and capacitors to be used.

According to the present invention there is provided a filter system including two signal paths having a common input terminal, a gate having two input terminals coupled to respective output terminals of the signal paths, one of the signal paths including a filter having a higher attenuation at a first signal frequency than at a second signal frequency, and means to obtain a gating signal from the output of the filter.

Figure 1:
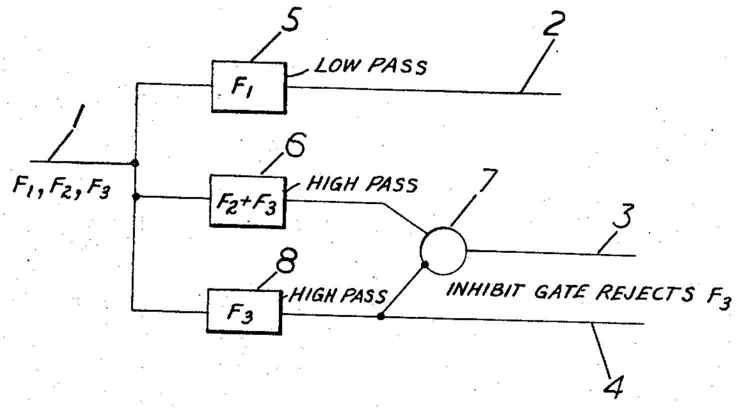
Figure 2:
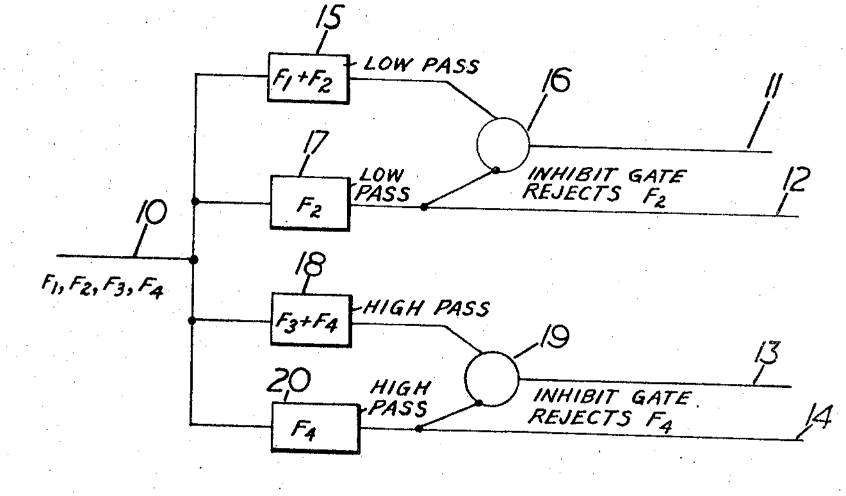
Figure 3:
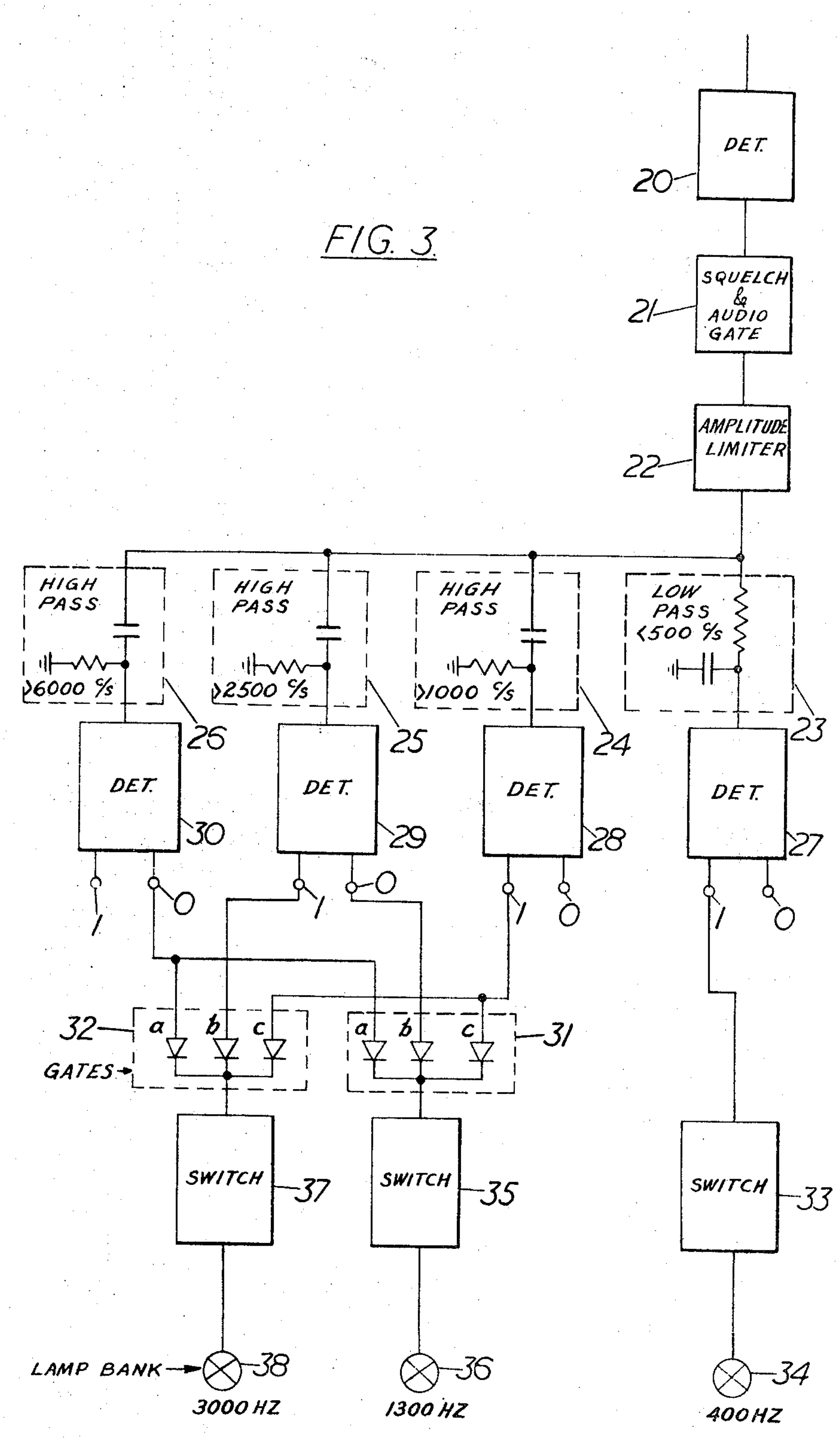

Embodiments of the invention will now be described with reference to the accompanying drawings in which FIGS. 1 and 2 are schematic diagrams illustrating the principle of operation of simple embodiments of the invention, and FIG. 3 is a schematic diagram of an embodiment of the invention in an aircraft marker beacon receiver.

Referring to FIG. 1, there is shown an input signal path 1 on which signals at three frequencies $F_1$, $F_2$ and $F_3$ are present at the same or different times, alternatively $F_1$, $F_2$ and $F_3$ may be regarded as the three frequency values of one signal. It is desired to route the signals at $F_1$, $F_2$ and $F_3$ to signal paths 2, 3 and 4 respectively. $F_1$ is the lowest of the three frequencies and $F_3$ is the highest.

The signal path 1 is coupled to the signal path 2 through a low-pass filter 5, to the signal path 3 through a high-pass filter 6 and an inhibit gate 7, and to the signal path 4 through a second high-pass filter 8. The output terminals of the filter 8 are coupled to input terminals of the inhibit gate 7 in order to control the operation of the gate. The low-pass filter 5 is designed to attenuate the signals at $F_2$ and $F_3$ to a much greater extent than the signal at $F_1$. The high-pass filter 6 is designed to pass the signals at $F_2$ and $F_3$ to reject those at $F_1$, the high-pass filter 8 is designed to pass the signal at $F_3$ and to reject those at $F_1$ and $F_2$.

The high-pass filter 6 attenuates, but does not reject, the signal at frequency $F_3$. Therefore, filter 6 passes frequency $F_3$ with a reduced amplitude as compared with the amplitude of the signal $F_2$ which is required to pass.

It is, therefore, necessary to provide some means of preventing the low amplitude signal at $F_3$ from reaching the signal path 3. This is done by means of the inhibit gate 7 which is blocked to prevent an output signal in path 3 during the presence of the signals at frequency $F_3$ emanating from the output terminals of the filter 8. In the presence of signals at $F_2$, the output signal from the filter 8 is of insufficient level to inhibit the gate 7 which is normally conductive and the signal at $F_2$ is therefore passed to the signal path 3.

The minimum frequency separation between the signals is dependent upon the sharpness of the attenuation characteristic of the filters and upon the decisiveness of operation of the inhibit gate 7.

In the above example, the system would operate equally well with the filter 5 replaced by a filter designed to pass $F_1$ and $F_2$ and filter 6 replaced by a filter designed to pass the frequency $F_2$. The signal input terminal of the gate 7 is then coupled to the output terminal of the filter 5, the inhibit terminals of the gate 7 is coupled to the output terminals of the filter 6, and the output terminal of the gate 7 is coupled to the signal path 2.

FIG. 2 shows a filter system for separating signals of four freqencies $F_1$, $F_2$, $F_3$ and $F_4$ which occur at different times on an input signal path, alternatively $F_1$, $F_2$, $F_3$ and $F_4$ may be regarded as four possible frequency values of one signal. Referring to FIG. 2, there is shown an input signal path 10 on which signals appear at four frequencies $F_1$, $F_2$, $F_3$, and $F_4$, in ascending order of frequencies, at different times. It is desired to route the signals at $F_1$, $F_2$, $F_3$ and $F_4$ to signal paths 11, 12, 13 and 14, respectively.

The signal path 10 is coupled to the signal path 11 through a low-pass filter 15 and an inhibit gate 16, to the signal path 12 through a low-pass filter 17, to the signal path 13 through a high-pass filter 18 and an inhibit gate 19, and to the signal path 14 through a high-pass filter 20. The inhibit terminal of the inhibit gate 16 is coupled to the output terminal of the low-pass filter 17 and the inhibit terminal of the inhibit gate 19 is coupled to the output terminal of the high-pass filter 20. The output terminals of the gates 16 and 19 are coupled to signal paths 11 and 13 respectively.

The filters 15, 17, 18 and 20 are designed to pass the signal frequencies $F_1+F_2$, $F_2$, $F_3+F_4$, and $F_4$, respectively. The low-pass filter 15, thus passes the frequency $F_1$ as well as $F_2$, the frequency $F_2$ is, however, prevented from reaching the signal path 11 by the inhibit gate 16 which is blocked when the frequency $F_2$ is present at the output terminals of the filter 15.

The high-pass filter 18 passes the frequency $F_4$ as well as $F_3$. The frequency $F_4$ is however prevented from reaching the signal path 13 by the inhibit gate 19 which is blocked when the frequency $F_4$ is present at the output terminals of the filter 20.

In the two examples described it has been assumed that the gate is directly controlled by one of the signals present at the output of one of the filters. In practice, it may be more convenient to operate the gate by a control signal derived from one of the signals present at the output of one of the filters. Such a control signal may be obtained by way of example, by putting a detector, the output signal of which is of binary form, between the output terminals of one of the filters and the control input terminals of the inhibit gate.

It has also been assumed in the two examples described that it is desired to route the input signals to the output signal channels unchanged as to form. Means may be provided, as in the next embodiment of the invention to be described, to change the form of the input signals before feeding them either via a gate or directly to a corresponding output signal channel.

An embodiment of the invention in an aircraft marker receiver is shown in FIG. 3. Referring to FIG. 3 the signal output from a detector 20 of the receiver is fed via a squelch circuit and audio gate 21 to an amplitude limiter 22. Depending upon the position of the aircraft along its path of descent, signals at any one of the frequencies of 400 c./s., 1300 c./s. and 3000 c./s. may be present at the output terminals of the amplitude limiter 22. It is required to convert these signals to binary form and then use them to cause the appropriate one of three indicator lamps, each corresponding to one of the signal frequencies, to be switched on.

The output terminals of the amplitude limiter 22 are connected to a low-pass resistance-capacitance filter 23 and three high-pass filters 24, 25 and 26 which are also of resistance-capacitance type. The output terminals of the filters 23 to 26 are connected to the input terminals of detectors 27 to 30, respectively.

These detectors are all similar and each produces an output signal of binary form at two sets of output terminals 0 and 1. If no signal is applied to the input terminals of any one of the detectors, the detector is said to be in the OFF condition. The voltage at the 1 terminals is then equal to the maximum available, and the output voltage at the 0 terminals is equal to approximately one-half of the available voltage. If an A.C. signal of sufficient voltage is applied to the input terminals of any one of the detectors the conditions are reversed and the detector is said to be in the ON condition. The output voltage at the 1 terminals is then one-half the available voltage and the output voltage at the 0 terminals is equal to the available voltage.

The 1 terminals of the detector 28 are connected to one input (*c*) of a diode gate 31 and also to one input (*c*) of a diode gate 32.

The 0 terminals of the detector 29 are connected to a second input (*b*) of the diode gate 31, and the 1 terminals of the detector 29 are connected to a second input (*b*) of the diode gate 32. The 0 terminals of the detector 30 are connected to a third input (*a*) to the diode gate 31 and also to a third input (*a*) to the diode gate 32. The 1 terminals of the detector 27 are connected to the input of a transistor switch 33 which controls the power-supply to an indicator lamp 34.

The output of the diode gate 31 is connected to a transistor switch 35, similar to the switch 33, which controls the power supply to a second indicator lamp 36. The output of the gate 32 is connected to a further transistor switch 37, similar to the switch 35, which controls the power supply to a third indicator lamp 38.

The gates 31 and 32 act as 3-input AND-gates which are maintained blocked on dissimilar inputs (as between their respective inputs), but are unblocked, or opened, in the presence of three similar inputs of one-half the available voltage. With the directions shown for the diode rectifiers, this voltage is negative, and the diodes will be biased accordingly so as to conduct on half the negative available voltage.

The transistor switches 33, 35, 37 similarly respond to a reduction of negative power supply from full to half-value to operate, and thus switch on the power to the indicator lamps.

The frequency response of the low-pass filter 23 is such that the associated detector 27 is switched to the ON condition if the signal frequency from the output of the amplitude limiter 22 is below 500 c./s. This causes the transistor switch 33 to close and the lamp 34 to be lit.

The frequency response of the high-pass filter 24 is such that the detector 28 is switched to the ON condition when the signal frequency is above 1000 c./s. The frequency responses of the high-pass filters 25 and 26 are such that the detectors 29 and 30 are switched to the ON condition at frequencies above 2,500 c./s. and 6000 c./s. respectively.

When the aircraft is in a position during its approach to the marker such that the signal frequency at the output terminals of the limiter 22 is 400 c./s., the detector 27 is switched to the ON condition and the indicator lamp 34 is lit.

When the aircraft is in a position such that the signal frequency at the output terminals ofthe limiter 22 is 1300 c./s., the voltage at the output of the gate 31 is such that the switch 35 is closed causing the lamp 36 to be lit, whilst the lamps 38 and 34 are unlit.

When the aircraft is in a position such that the signal frequency at the output terminals of the limiter 22 is 3000 c./s., the voltage at the output of the gates 31 and 32 is such that the switch 35 is open whilst the switch 37 is closed causing the lamp 38 to be lit while the lamps 34 and 36 are unlit. Both switches 35 and 37 are opened in the presence of noise owing to the signal condition at the output of the detector 30 associated with the 6000 c./s. highpass filter 26. The indicator lamps 36 and 38 are thereby prevented from being switched on due to the presence of noise. The low-pass filter 23 has sufficient attenuation to prevent noise from causing the lamp 34 to be lit.

These conditions may be summarized in a table (below I) in which the potentials existing on the various component gates of 31 and 32 for the various frequencies, when present, are shown as ½ or 1 respectively. This table may be converted to the familiar "truth table" (below-II) by replacing the ½ terms by 1's, and the 1 terms by 0's, the condition for an open (through) gate comprising three 1's simultaneously present; and for a closed gate, any other mixture of 1's and 0's. The tables have been completed by including the conditions existing at the switches 33, 35 and 37 for the various frequencies.

TABLE I

[Detectors 27-30: OFF—1 at full power supply potential, 0 at half power supply potential; ON—1 at half power supply potential; 0 at full power supply potential]

| | 400 c./s. | 1,300 c./s. | 3,000 c./s. | 6,000 c./s. |
|---|---|---|---|---|
| Gate: | | | | |
| 31a | ½ | ½ | ½ | 1 |
| 31b | ½ | ½ | 1 | 1 |
| 31c | 1 | ½ | ½ | ½ |
| 32a | ½ | ½ | ½ | 1 |
| 32b | 1 | 1 | ½ | ½ |
| 32c | 1 | ½ | ½ | ½ |
| Switch 33 | ½ | 1 | 1 | 1 |

TABLE II

| | 400 c./s. | 1,300 c./s. | 3,000 c./s. | 6,000 c./s. |
|---|---|---|---|---|
| Gate: | | | | |
| 31a | 1 | 1 | 1 | 0 |
| 31b | 1 | 1 | 0 | 0 |
| 31c | 0 | 1 | 1 | 1 |
| 32a | 1 | 1 | 1 | 0 |
| 32b | 0 | 0 | 1 | 1 |
| 32c | 0 | 1 | 1 | 1 |
| Switch 33 | 1 | 0 | 0 | 0 |
| Switch 35 | 0 | 1 | 0 | 0 |
| Switch 37 | 0 | 0 | 1 | 0 |

The purpose of the audio gate and squelch circuit 21 is to ensure that the detectors 28 and 29 operate simultaneously in the presence of a 3000 c./s. signal. The squelch circuit causes the audio gate to be blocked if the amplitude of the audio signal from the receiver detector 20 falls below a level sufficient to saturate the limiter 22. If the squelch circuit and audio gate were omitted, a signal at 3000 c./s. of amplitude which is insufficient to saturate the limiter may cause the detector 28 associated with the 1300 c./s. filter 24 to be switched to the ON condition before the detector 29 associated with the 3000 c./s. filter.

The aircraft marker receiver in which this embodiment of the invention is embodied is of micro-miniature construction. The detectors 27, 28, 29 and 30 and the transistor switches 33, 35, and 37 utilise thin film circuits. As the filter networks 23, 24, 25 and 26 are simple resistance-capacitance networks the complete filter system, although possibly more complex than one relying solely on tuned circuits for the separation of the signal frequencies, is suitable for the application of microminiature techniques with a resulting saving in space and weight. The principles of the invention can of course equally well be applied to circuits constructed from standard size components.

In other embodiments of the invention, instead of arranging an inhibit gate in series with the output of one (or more) of the filters, it would be possible to use an AND gate connected in one of the signal paths in such a way that when the gate is conductive the signal is effectively short circuited. The two input signals to the gate would be derived from the signal outputs of two of the filters so that the simultaneous presence of signals at the output of both filters would cause the signals in the appropriate signal path to be short-circuited.

I claim:

1. A receiver for separating first, second and third input signals of first, second and third respective frequencies into first, second and third channel outputs, comprising:

first detector means for receiving said input signals;

an amplitude limiter;

means coupling said first detector means to said limiter for squelching those of said input signals that have insufficient amplitude to saturate said limiter;

a low pass filter coupled to said limiter, said low pass filter transmitting only said first input signal of said first frequency;

a first high pass filter coupled to said limiter, said first high pass filter transmitting only said second and third input signals of said second and third respective frequencies;

a second high pass filter coupled to said limiter, said second high pass filter transmitting only said third input signal of said third respective frequency;

second detector means coupled to said low pass filter for converting said first input signal to binary form, said second detector means having first and second output terminals;

third detector means coupled to said first high pass filter for converting said second and third input signals to binary form, said third detector means having first and second output terminals;

fourth detector means coupled to said second high pass filter for converting said third input signal to binary form, said fourth detector means having first and second output terminals;

first and second And gates having at least first and second respective input terminals and one respective output terminal, the first output terminal of said third detector means being coupled to the first input terminals of said respective first and second And gates, the first output terminal of said fourth detector means being coupled to the second input terminal of said second And gate, the second output terminal of said fourth detector means being coupled to the second input of said first And gate;

first switching means coupling said first channel output to the first output terminal of said second detector means, whereby upon detection of said first frequency by said second detector means, said first switching means is activated to allow the transmission of said first input signal only to said first channel output;

second switching means coupling said second channel output to said one output terminal of said first And gate, whereby upon detection of said second frequency by said third detector means, said first And gate enables the activation of said second switching means to allow the transmission of said second input signal only to said second channel output; and third switching means coupling said third channel output to said one output terminal of said second And gate, whereby upon detection of said third frequency by said third and fourth detector means, said first And gate is inhibited to prevent the transmission of said third input signal to said second channel output, and said second And gate enables the activation of said third switching means to allow the transmission of said third input signal only to said third channel output.

2. A receiver according to claim 1 further including:

a third high pass filter coupled to said limiter, said third high pass filter transmitting signals having frequencies above the frequencies of said first, second and third input signals;

said first and second And gates having a third respective input terminal;

fifth detector means coupled to said third high pass filter for converting received signals to binary form, said fifth detector means having first and second output terminals, the second output terminal of said fifth detector means coupled to the third terminals of said first and second And gates to inhibit said first and second And gates upon the detection of an unwanted high frequency signal by said fifth detector means thereby preventing transmission of said unwanted high frequency signals to said second and third channel outputs.

References Cited

UNITED STATES PATENTS

| | | | |
|---|---|---|---|
| 2,820,896 | 1/1958 | Russell et al. | 328—159X |
| 2,892,082 | 6/1959 | Single | 328—138 |
| 3,319,225 | 5/1967 | Anderson et al. | 328—138X |

DONALD D. FORRER, Primary Examiner

J. ZAZWORSKY, Assistant Examiner

U.S. Cl. X.R.

307—233; 328—138, 167